(12) United States Patent
Park et al.

(10) Patent No.: US 7,187,118 B2
(45) Date of Patent: Mar. 6, 2007

(54) DUAL PANEL TYPE ORGANIC ELECTRO LUMINESCENT DISPLAY DEVICE AND MANUFACTURING METHOD FOR THE SAME

(75) Inventors: Jae Yong Park, Gyeonggi (KR); Nam-Yang Lee, Gyeonggi-do (KR); Budiman Sastra, Seodnemun-gu (KR)

(73) Assignee: LG.Philips LCD Co., Ltd., Seoul (KR)

( * ) Notice: Subject to any disclaimer, the term of this patent is extended or adjusted under 35 U.S.C. 154(b) by 101 days.

(21) Appl. No.: 10/685,477

(22) Filed: Oct. 16, 2003

(65) Prior Publication Data

US 2004/0080262 A1    Apr. 29, 2004

(30) Foreign Application Priority Data

Oct. 29, 2002    (KR)    ............ 10-2002-0066188

(51) Int. Cl.
   H01J 1/62      (2006.01)
   H01J 63/04    (2006.01)

(52) U.S. Cl. .............. 313/504; 313/506; 313/512; 445/24

(58) Field of Classification Search ........... 313/504, 313/498, 499, 506, 511, 512; 257/E21.703, 257/E27.111; 428/917, 690; 345/36, 45, 345/76; 445/24, 25
See application file for complete search history.

(56) References Cited

U.S. PATENT DOCUMENTS

| | | | |
|---|---|---|---|
| 5,276,380 A | 1/1994 | Tang | 313/504 |
| 5,294,869 A | 3/1994 | Tang et al. | 313/504 |
| 5,294,870 A | 3/1994 | Tang et al. | 313/504 |
| 5,701,055 A | 12/1997 | Nagayama et al. | 313/504 |
| 5,742,129 A | 4/1998 | Nagayama et al. | 315/167 |
| 5,952,037 A | 9/1999 | Nagayama et al. | 427/66 |
| 6,046,547 A | 4/2000 | Nishio et al. | 315/169.3 |
| 6,175,345 B1 | 1/2001 | Kuribayashi et al. | 345/76 |
| 6,373,455 B1 | 4/2002 | Kuribayashi et al. | 345/76 |
| 6,420,834 B2 * | 7/2002 | Yamazaki et al. | 315/169.3 |
| 6,426,245 B1 * | 7/2002 | Kawasaki et al. | 438/166 |
| 6,870,186 B2 * | 3/2005 | Park et al. | 257/59 |
| 2001/0009283 A1 * | 7/2001 | Arao et al. | 257/303 |
| 2004/0084673 A1 * | 5/2004 | Hirakata et al. | 257/59 |

* cited by examiner

*Primary Examiner*—Karabi Guharay
*Assistant Examiner*—Kevin Quarterman
(74) *Attorney, Agent, or Firm*—Morgan, Lewis & Bockius, LLP

(57) ABSTRACT

An organic electroluminescent display (ELD) device includes first and second substrates having a plurality of sub-pixels defined thereon, the first and second substrates being spaced apart from and opposing each other, an array element layer on the first substrate, the array element layer having a plurality of thin film transistors corresponding to each sub-pixel, a first electrode on an inner side of the second substrate, an organic light-emitting layer beneath the first electrode, a second electrode corresponding to each sub-pixel beneath the organic light-emitting layer, a plurality of electrical connecting patterns corresponding to each sub-pixel between the array element layer and the second electrode, the electrical connecting pattern being formed of material having a plastic deformation property, and a seal pattern formed on one of the first and second substrates, wherein a height of the electrical connecting pattern is smaller than an original height of the electrical connecting pattern measured before an attachment of the first and second substrates.

23 Claims, 9 Drawing Sheets

US 7,187,118 B2

DUAL PANEL TYPE ORGANIC ELECTRO LUMINESCENT DISPLAY DEVICE AND MANUFACTURING METHOD FOR THE SAME

This application claims the benefit of Korean Patent Application No. 2002-66188, filed on Oct. 29, 2002 in Korea, which is hereby incorporated by reference.

BACKGROUND OF THE INVENTION

1. Field of the Invention

The present invention relates to a flat panel display device and more particularly, to an organic electroluminescent display (ELD) device and manufacturing method for the same.

2. Discussion of the Related Art

Liquid crystal display (LCD) devices have been most widely used in the field of flat panel display devices due to their lightweight and low power consumption. However, the liquid crystal display (LCD) device is not a light emitting element but rather a light receiving element that needs an additional light source to display images. Thus, there is a technical limit in improving brightness, contrast ratio and viewing angle as well as in enlarging the size of a liquid crystal display panel. For these reasons, much research has been actively pursued in this field to develop a new flat panel display element that can overcome the aforementioned problems of the LCD device.

The organic electroluminescent display (ELD) device is one of the those new flat panel display elements designed to replace the LCD device. Because the organic electroluminescent display (ELD) device actually emits light, the viewing angle and the contrast ratio is superior compared to the liquid crystal display (LCD) device. In addition, because an ELD device does not need a backlight as the light source, it has advantages, such as a lightweight, small dimension and low power consumption. Moreover, the organic electroluminescent display (ELD) device can be driven with a low DC (direct current) and has a fast response time. Because the organic electroluminescent display (ELD) device uses solid material instead of fluid material, such as liquid crystal, it is more stable under external impact. Further, the organic electroluminescent display (ELD) device can be operated throughout a wider range of temperatures than the liquid crystal display (LCD) device.

The organic electroluminescent display (ELD) device also has an advantage in terms of a production cost. More specifically, a deposition apparatus and an encapsulation apparatus are all the apparatuses used for manufacturing the organic electroluminescent display (ELD) device while the liquid crystal display (LCD) device or Plasma display panels (PDPs) need many kind of apparatuses. Thus, the manufacturing process for the organic electroluminescent display (ELD) device is very simple compared to the manufacturing process for liquid crystal display (LCD) device or the Plasma display panels (PDPs).

The organic electroluminescent display (ELD) devices may be classified into a passive matrix-type and an active matrix-type. In the case of the passive matrix-type organic electroluminescent display (ELD) device, pixels are formed in a matrix between scan lines and the signal lines that cross each other. The scan lines must be sequentially driven to drive each pixel. Accordingly, an average luminance depends on the number of the scan lines. However, in the case of the active matrix-type organic electroluminescent display (ELD) device, a thin film transistor, i.e., a switching element, is formed in each sub-pixel to switch the pixel on and off. More specifically, a pixel electrode connected to the thin film transistor is turn on and off. In addition, a second electrode functions as a common electrode. Moreover, in case of the active matrix-type organic electroluminescent display (ELD) device, a voltage that is applied to the pixel is stored to a storage capacitor $C_{ST}$ and maintained until a signal for the next frame is applied. Accordingly, the pixel can retain the signal until the next frame regardless of the number of the scan lines. Because the active matrix-type organic electroluminescent display (ELD) device can obtain the same luminance with low direct current (DC), the active matrix-type organic electroluminescent display (ELD) device has advantages of low power consumption, high resolution and a large size. A basic structure and a operational property of the active matrix-type organic electroluminescent display (ELD) device will be described hereinafter with reference to FIG. 1.

FIG. 1 is a circuit diagram of a pixel of a related art active matrix organic electroluminescent display (ELD) device. In FIG. 1, scan line 2 is formed in a first direction and signal and power supply lines 4 and 6 are formed in a second direction perpendicular to the first direction. The signal line 4 and the power supply line 6 are spaced apart from each other and define a sub-pixel by crossing the scan line 2. A switching thin film transistor 8, i.e., an addressing element, is formed at a position near an intersection of the scan and signal lines 2 and 4. A storage capacitor ($C_{ST}$) 12 is electrically connected to the switching thin film transistor 8 and the power supply line 6. A driving thin film transistor 10, i.e., a current source element, is electrically connected to the storage capacitor ($C_{ST}$) 12 and the power supply line 6 and an organic electroluminescent diode 14 is electrically connected to the driving thin film transistor 10. If current is applied to the organic light-emitting material of the organic electroluminescent display (ELD) device in a positive direction, electrons and holes recombine about P-N junction between anode electrode for proving holes and cathode electrode for proving electrons. The combined electron and the hole require less energy than the energies in both the electron and the hole when they are not combined. Thus, the organic electroluminescent display (ELD) device utilizes the principle that light is emitted as a result of the energy difference between before and after the combination of the electron and the hole.

FIG. 2 is a cross-sectional view of a related art active matrix organic electroluminescent display device. In FIG. 2, the organic electroluminescent display (ELD) device has first and second substrate 10 and 50 spaced apart from each other. An array element layer 30 including a plurality of thin film transistors formed in each sub-pixel is formed on the first substrate 10. A first electrode 32 electrically connected to the thin film transistor is formed on the array element layer 30 corresponding to each pixel. An organic light-emitting layer 34 for displaying red (R), green (G) and blue (B) colors in each sub-pixel is formed on the first electrode 32 and a second electrode 38 is formed on the organic light-emitting layer 34. The organic light-emitting layer 34 forms an organic electroluminescent diode element "E" together with the first and second electrodes 32 and 38. The second substrate 50 that is used for an encapsulation has concave portion 52 and an absorbent desiccant 54 is filled into the concave portion 52. The moisture absorbent desiccant 54 removes moisture and oxygen that may be infiltrated into an interior of the organic electroluminescent display (ELD) device. The organic electroluminescent display (ELD) device is completed by bonding the first and second substrates 10 and 50 together by disposing a sealant 70 between the first and second substrates 10 and 50.

The related art bottom emission-type organic electroluminescent display (ELD) device is commonly manufactured by forming a thin film transistor array part and an organic light-emitting part on a same substrate, and then bonding the substrate to an encapsulating structure. If the thin film transistor array part and the organic light-emitting-part are formed on the same substrate, then a yield of a panel having the thin film transistor array part and the organic light-emitting part is dependent upon the product of the individual yields of the thin film transistor array part and the organic light-emitting part. However, the yield of the panel is greatly affected by the yield of the organic light-emitting layer. Accordingly, if an inferior organic light-emitting layer that is usually formed of a thin film having a thickness of 1000 Å has a defect due to impurities and contaminants, the panel is classified as an inferior panel. This leads to wasted production costs and material, thereby decreasing the yield of the panel.

The bottom emission-type organic electroluminescent display (ELD) devices are advantageous for their high image stability and variable fabrication processing. However, the bottom emission-type organic electroluminescent display (ELD) devices are not adequate for implementation in devices that require high resolution due to limitations of increased aperture ratio. In contrast, top emission-type organic electroluminescent display (ELD) devices emit light upward of the substrate. Thus, the light can be emitted without influencing the thin film transistor array part that is positioned under the light-emitting layer. Accordingly, design of the thin film transistor may be simplified. In addition, the aperture ratio can be increased, thereby increasing operational life span of the organic electroluminescent display (ELD) device. However, since a cathode is commonly formed over the organic light-emitting layer in the top emission-type organic electroluminescent display (ELD) devices, material selection and light transmittance are limited such that light transmission efficiency is lowered. If a thin film-type passivation layer is formed to prevent a reduction of the light transmittance, the thin film passivation layer may fail to prevent infiltration of exterior air into the device.

SUMMARY OF THE INVENTION

Accordingly, the present invention is directed to an organic electroluminescent display (ELD) device and manufacturing method for the same that substantially obviate one or more of the problems due to limitations and disadvantages of the related art.

An object of the present invention is to provide an organic electro luminescent display (ELD) device having a plurality of electrical connecting patterns to increase yield and productivity.

Another object of the present invention is to provide a manufacturing method for an organic electro luminescent display (ELD) device having a plurality of electrical connecting patterns to increase yield and productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display (ELD) device includes first and second substrates having a plurality of sub-pixels defined thereon, the first and second substrates being spaced apart from and opposing each other, an array element layer on the first substrate, the array element layer having a plurality of thin film transistors corresponding to each sub-pixel, a first electrode on an inner side of the second substrate, an organic light-emitting layer beneath the first electrode, a second electrode corresponding to each sub-pixel beneath the organic light-emitting layer, a plurality of electrical connecting patterns corresponding to each sub-pixel between the array element layer and the second electrode, the electrical connecting pattern being formed of material having a plastic deformation property, and a seal pattern formed on one of the first and second substrates, wherein a height of the electrical connecting pattern is smaller than an original height of the electrical connecting pattern measured before an attachment of the first and second substrates.

The height of the electrical connecting pattern may be preferably be between 80~95% of the original height of the electrical connecting pattern measured before the attachment of the first and second substrates. The electrical connecting pattern can be formed of conductive organic material. The organic electroluminescent display (ELD) device can further include a protection electrode between the second electrode and the electrical connecting pattern, wherein the protection electrode has a pattern structure corresponding to the second electrode. The electrical connecting pattern can be electrically connected to the second electrode via the protection electrode. The organic electroluminescent display (ELD) device can further include a connecting electrode on the array element layer, wherein the connecting electrode is connected to the thin film transistor. The electrical connecting pattern can be electrically connected to the thin film transistor via the connecting electrode. The thin film transistor can have a gate electrode, a source electrode and a drain electrode, and the connecting electrode is connected to the drain electrode. The electrical connecting pattern can be formed on the array element layer. The organic electroluminescent display (ELD) device is a top emission-type.

In another aspect, a method for manufacturing an organic electroluminescent display (ELD) device includes steps of forming an array element layer on a first substrate on which a plurality of sub-pixels are defined, the array element layer having a plurality of thin film transistors corresponding to each sub-pixel, forming an electrical connecting pattern having a first height on the array element layer corresponding to each sub-pixel, the electrical connecting pattern being formed of material having a plastic deformation property, forming an organic electroluminescent diode on a second substrate, the organic electroluminescent diode having first and second electrodes and an organic light-emitting layer between the first and second electrodes, forming a seal pattern on one of the first and second substrates; and attaching the first and second substrates together, wherein the first height of the electrical connecting pattern is reduced to a second height by applying a plastic deformation force to the electrical connecting pattern during the step of attaching the first and second substrates.

The manufacturing method can further include a step of forming a connecting electrode corresponding to each sub-pixel on the array element layer after the step of forming the array element layer. The step of forming the array element layer can include forming the thin film transistor having a gate electrode, a source electrode and a drain electrode, wherein the connecting electrode is connected to the drain electrode. The manufacturing method may further include a step of forming a protection electrode corresponding to each sub-pixel and having a pattern structure corresponding to the second electrode after the step of forming the organic electroluminescent diode. The manufacturing method can further include a step of forming a connecting electrode corresponding to each sub-pixel on the array element layer after the step of forming the array element layer and a step of forming a protection electrode corresponding to each sub-pixel and having a pattern structure corresponding to the second electrode after the step of forming the organic electroluminescent diode. The thin film transistor is a driving thin film transistor. The organic electroluminescent display (ELD) device can be a top emission-type.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the embodiments of the present invention, which are illustrated in the accompanying drawings.

Figure 1:
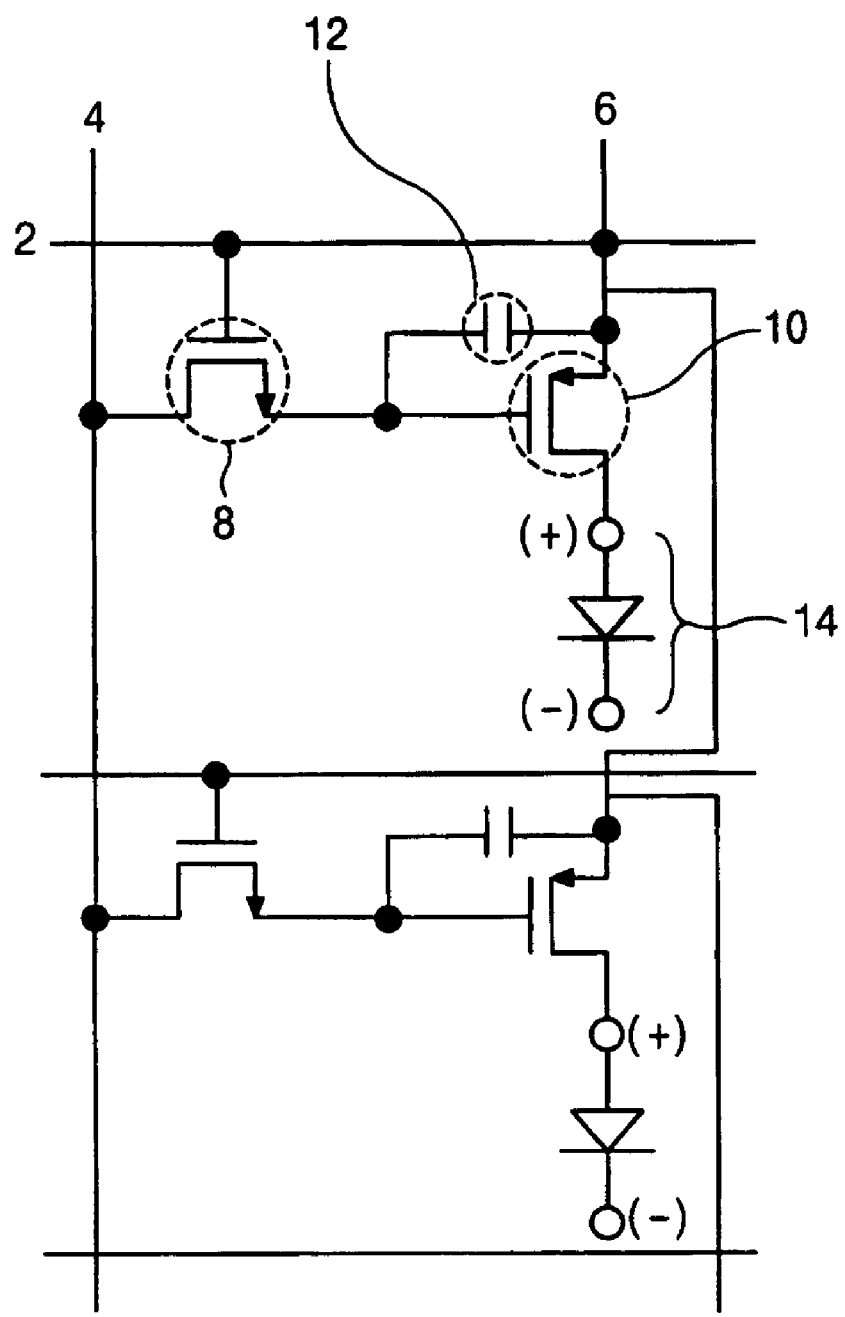
FIG. 1 is a circuit diagram of a pixel of a related art active matrix organic electroluminescent display (ELD) device.
Figure 2:
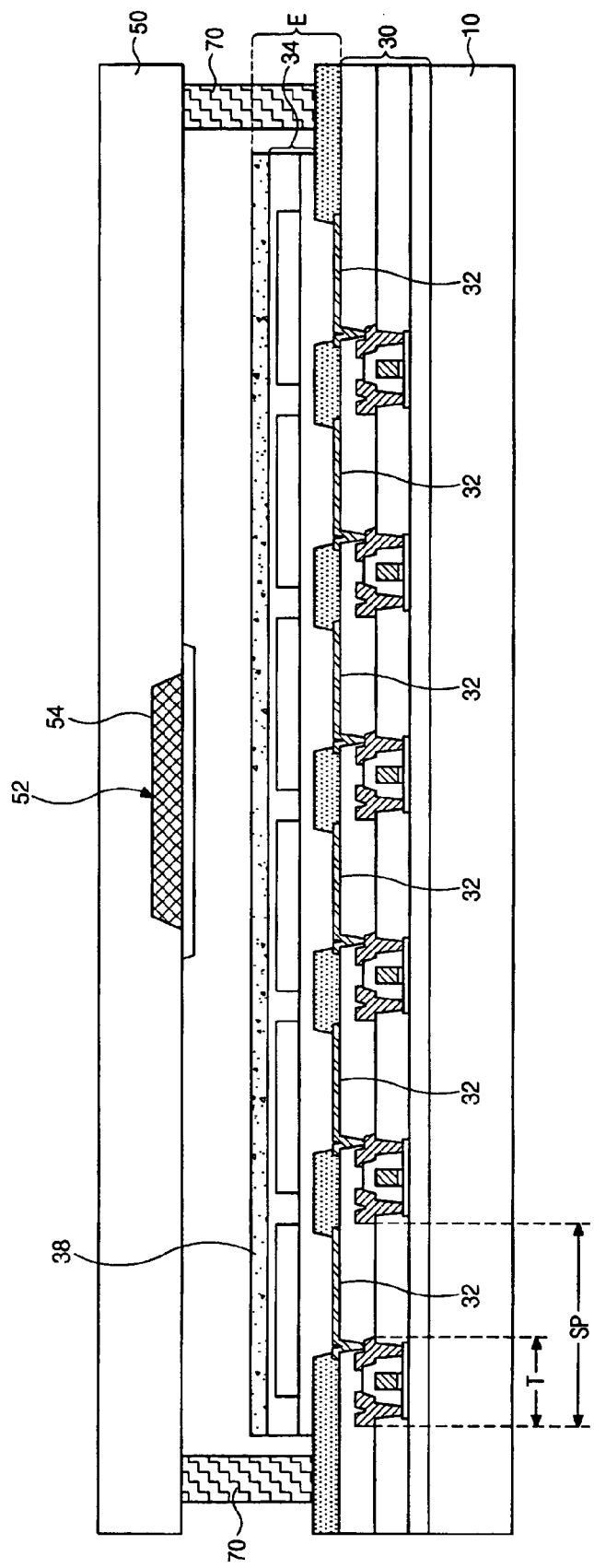
FIG. 2 is a cross-sectional view of a related art active matrix organic electroluminescent display device.
Figure 3:
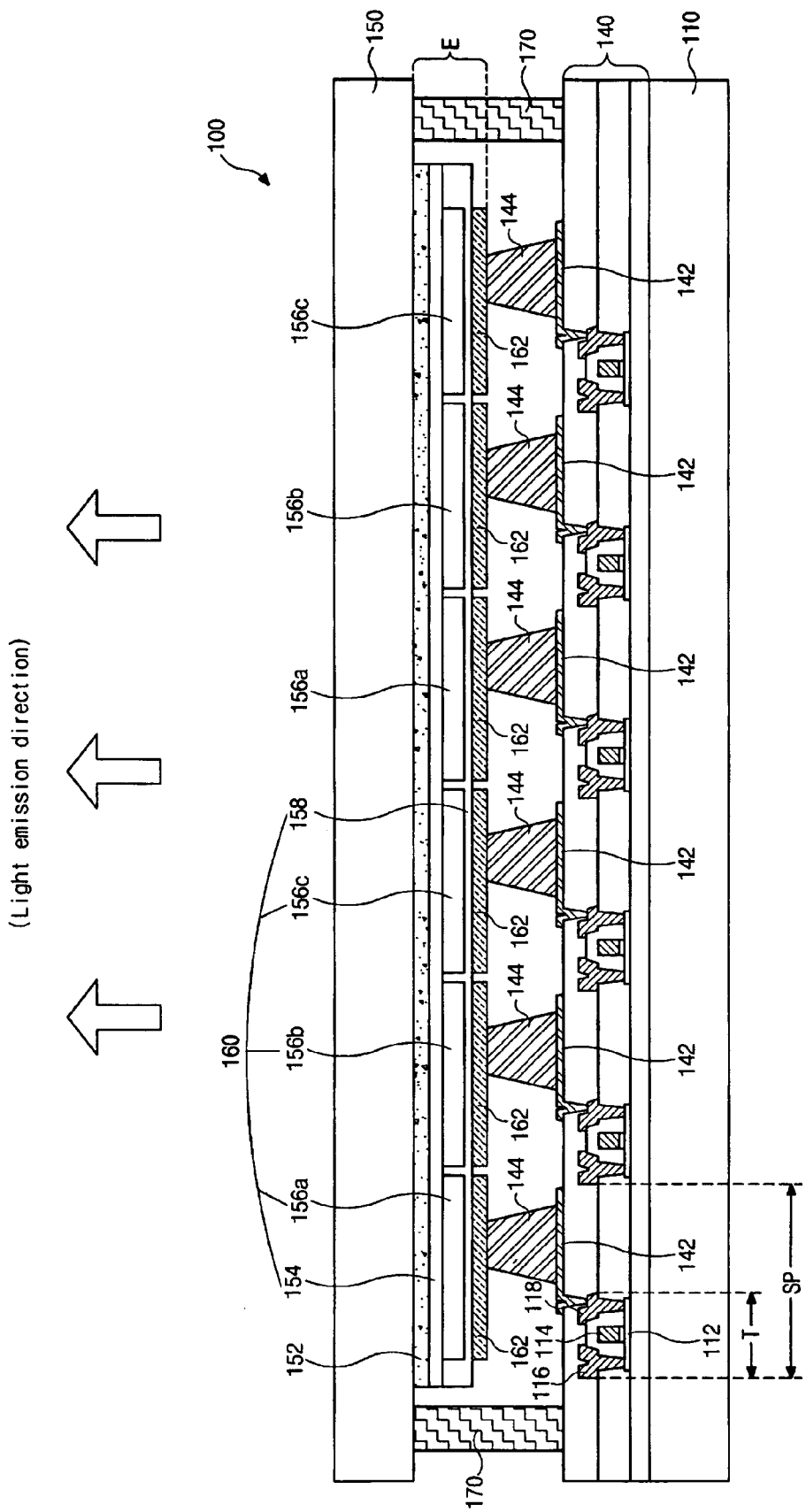
FIG. 3 is a cross-sectional view of a dual panel type organic electroluminescent display (ELD) device according to a first embodiment of the present invention.

FIG. 3 is a cross-sectional view of a dual panel type organic electroluminescent display (ELD) device according to a first embodiment of the present invention. In FIG. 3, an organic electroluminescent display (ELD) device 100 has first and second substrates 110 and 150 spaced apart from each other and opposing each other. A plurality of sub-pixels "SP" is defined on the first and second substrates 110 and 150.

An array element layer 140 having a plurality of thin film transistors "T" formed in each sub-pixel is formed on the first substrate 110. A connecting electrode 142 connected to the thin film transistor "T" is formed on the array element layer 140 and an electrical connecting pattern 144 contacting the connecting electrode 142 is formed on the connecting electrode 142. The electrical connecting pattern 144 may be formed to have a multi-layered structure including insulating material. The electrical connecting pattern 144 may be directly connected to the thin film transistor "T" omitting the connecting electrode 142. The thin film transistor "T" has a semiconductor layer 112, a gate electrode 114 and source and drain electrodes 116 and 118, and the aforementioned connecting electrode 142 is electrically connected to the drain electrode 118.

A first electrode 152 is formed on an inner surface of the second substrate 150, and an organic light-emitting layer 160 including main light-emitting layers 156a, 156b and 156c respectively for red (R), green (G) and blue (B) colors is formed on the first electrode 152. A plurality of second electrodes 162 is formed on the organic light-emitting layer 160 corresponding to each sub-pixel "SP". More specifically, the organic light-emitting layer 160 includes a first carrier transporting layer 154 contacting the first electrode 152 and a second carrier transporting layer 158 contacting the second electrode 162 as well as the main light-emitting layers 156a, 156b and 156c for the red (R), green (G) and blue (B) colors. If the first electrode 152 is the anode and the second electrode 162 is the cathode, the first carrier transporting layer 154 serves as a hole-inputting layer and a hole-transporting layer and the second carrier transporting layer 158 serves as an electron-transporting layer and an electron-inputting layer. The first and second electrode 152 and 162 and the organic light-emitting layer 160 interposed between the first and second electrodes 152 and 162 form an organic electroluminescent diode "E".

In the present invention, current from the thin film transistor "T" is delivered to the second electrode 162 via the connecting electrode 142 and then the electrical connecting pattern 144. The first and second substrates 110 and 150 are attached together by a seal pattern 170 between the first and second substrates 110 and 150. Though not shown in FIG. 3, at least one switching thin film transistor and at least one driving thin film transistor are formed for each sub-pixel "SP" and the thin film transistors "T" illustrated in FIG. 3 is the driving thin film transistor.

In the case of the dual panel type organic electroluminescent display (ELD) device according the first embodiment of the present invention, if the driving thin film transistor "T" is not properly connected to the second electrode 162 by the electrical connecting pattern 144 for each sub-pixel "SP", problems such as a point defect and irregular luminance distribution may occur. To overcome the aforementioned problems, the electrical connecting pattern 144 may be of material having a plastic deformation property as in a second embodiment of the present invention that will be described hereinafter with reference to FIG. 4. The dual panel-type organic electroluminescent display (ELD) devices that will be described hereinafter are the top emission-type organic electroluminescent display (ELD) device as in the first embodiment of the present invention.

Figure 4:
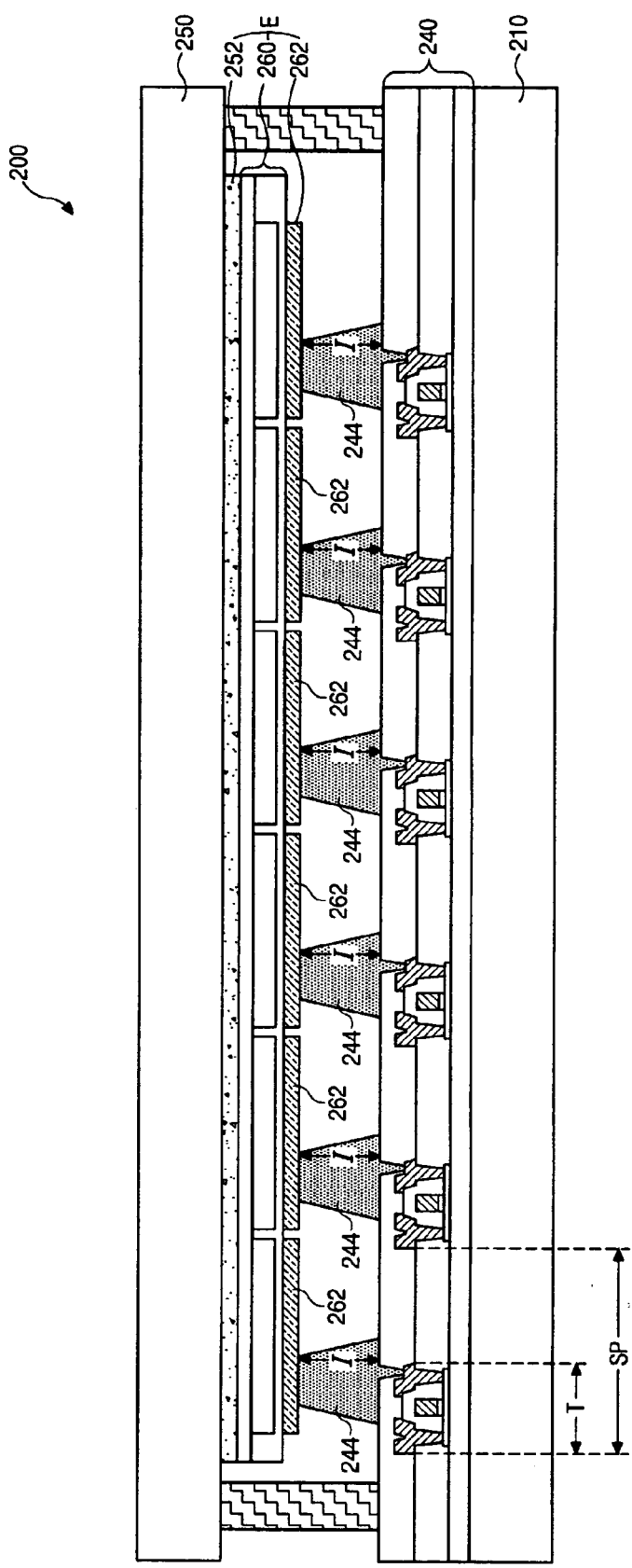
FIG. 4 is a cross-sectional view of a dual panel type organic electroluminescent display (ELD) device according to a second embodiment of the present invention.

FIG. 4 is a cross-sectional view of a dual panel type organic electroluminescent display (ELD) device according to a second embodiment of the present invention. Explanations for elements of the dual panel type organic electroluminescent display (ELD) device 200 having the same structures as those of the first embodiment of the present invention will be omitted for the sake of simplicity. In FIG. 4, a first substrate 210 having an array element layer 240 formed thereon and a second substrate 250 having an organic electroluminescent diode "E" including first and second electrodes 252 and 262 and an organic light-emitting layer 260 are spaced apart from each other and opposing each other. An electrical connecting pattern 244 is formed between the first and second substrates 210 and 250 to connect the array element layer 240 on the first substrate 210 with the organic electroluminescent diode "E". The electrical connecting pattern 244 is formed of material having a plastic deformation property and formed for each sub-pixel "SP". Although not shown in FIG. 4, the electrical connecting pattern 244 may desirably be formed in a center portion of the sub-pixel "SP". As mentioned before, the dual panel type organic electroluminescent display (ELD) device according to the second embodiment of the present invention is the top emission type organic electroluminescent display (ELD) device in which the organic light-emitting layer 260 emits light towards the first electrode 252, i.e., an upper electrode 252. Accordingly, because the light is transmitted through a substrate having a superior endurance instead of a thin passivation layer unlike the related art, a reliability of the product can be increased. In addition, because the organic electroluminescent diode "E" is formed on a separate substrate from the array element layer, an aperture ratio can be increased regardless of a structure of the thin film transistor "T".

Once the electrical connecting pattern 244 is attached to the array element layer 240 and the second electrode 262, the electrical connecting pattern 244 is compressed and a height "I" of the electrically connecting pattern 244 is reduced by the compression because the electrical connecting pattern 244 is formed of a material having the plastic deformation property. A contact property between the array element layer 240 and the organic electroluminescent diode "E" can be improved by implementing the electrical connecting pattern 244 having the plastic deformation property. The electrical connecting pattern 244 having the plastic deformation property is desirably formed of conductive organic material.

Figure 5A:
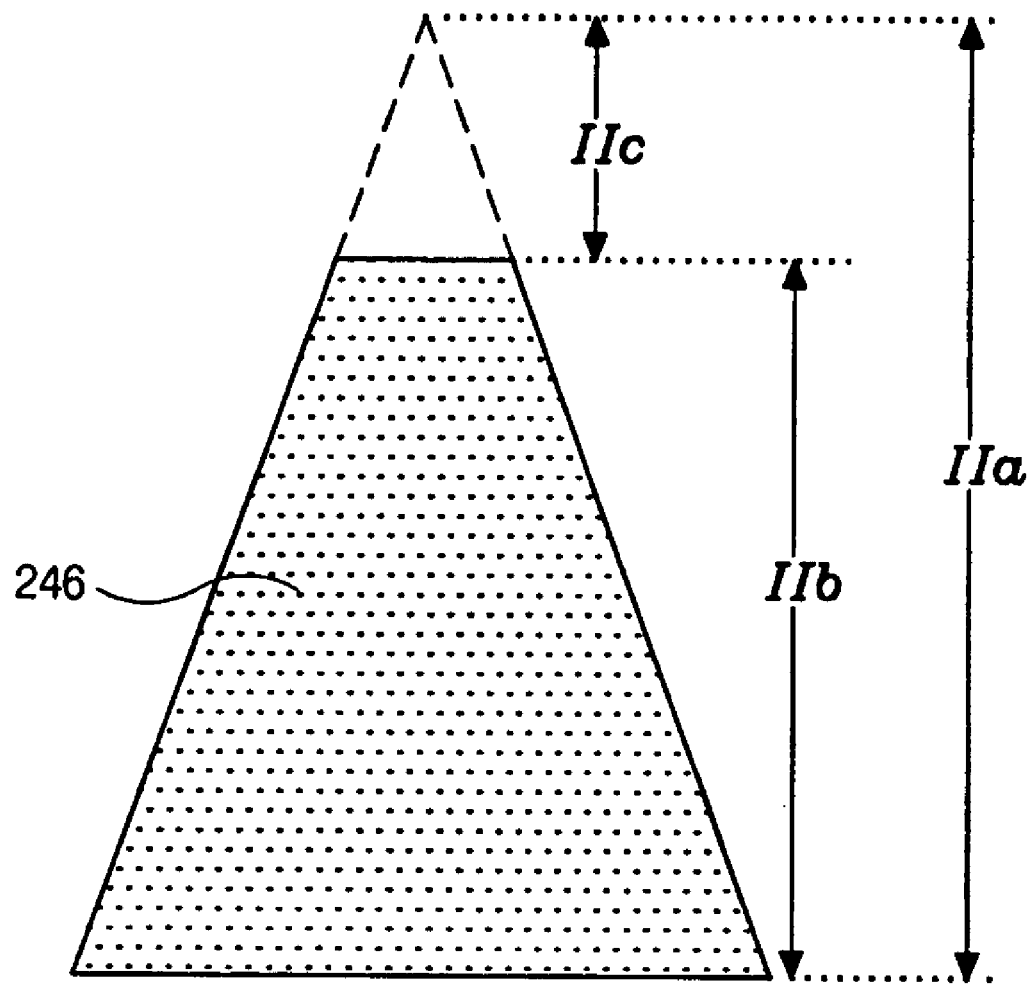
FIGS. 5A and 5B are cross-sectional views of an electrical connecting pattern to explain a plastic deformation property that is required for the second embodiment of the present invention.
Figure 5B:
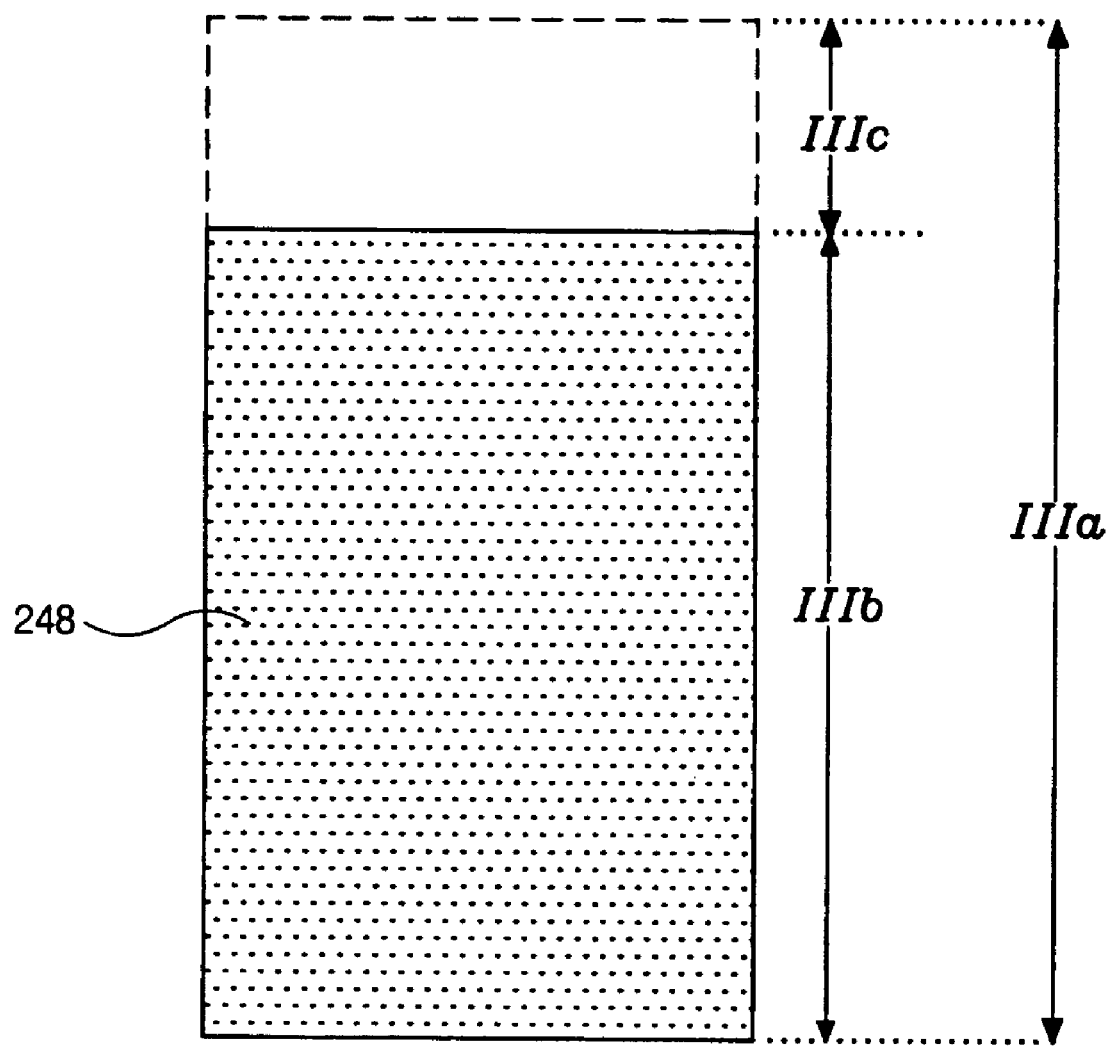

FIGS. 5A and 5B are cross-sectional views of the electrical connecting pattern to explain a plastic deformation property that is required for the second embodiment of the present invention. FIG. 5A and FIG. 5B are respectively for the electrical connecting patterns having a triangular cross section and a rectangular cross section. In FIG. 5A, an original height of the electrical connecting pattern 246 before an attachment to the array element layer 240 and the organic electroluminescent diode "E" is defined as a first height "IIa", a height of the electrical connecting pattern 246 after the attachment is defined as a second height "IIb" and a difference between the first height "IIa" and the second height "IIb" is defined as a third height "IIc". The first and third heights "IIa" and "IIc" preferably satisfy the following expression EQ 1.

$$(IIc/IIa) \times 100 = 5{\sim}20\% \qquad (EQ\ 1)$$

The same principle can be applied to the electrical connecting pattern 248 having a rectangular cross section as in FIG. 5B. When an original height of the electrical connecting pattern 248 before an attachment to the array element layer 240 and the organic electroluminescent diode "E" is defined as a fourth height "IIIa", a height of the electrical connecting pattern 248 after the attachment is defined as a fifth height "IIIb" and a difference of the fourth height "IIIa" and the "IIIb" is defined as a sixth height "IIIc", the fourth height "IIIa" and the sixth height "IIIc" preferably satisfy the following expression EQ 2.

$$(IIIc/IIIa) \times 100 = 5{\sim}20\% \qquad (EQ\ 2)$$

As mentioned above, a plastic deformation range of the electrical connecting pattern is preferably between 5% and 20% according to an exemplary embodiment of the present invention. The flatness of a glass substrate that is usually used for a base substrate of the organic electroluminescent display (ELD) device is generally above 5%. Accordingly, if the electrical connecting pattern has the plastic deformation range of under 5%, the electrical connecting pattern cannot contact the array element layer 240 in FIG. 4 and the organic electroluminescent diode "E" in FIG. 4 enough to deliver an electrical signal from the thin film transistor "T" in FIG. 4 to the second electrode 262 in FIG. 4. On the other hand, if the electrical connecting pattern 244 in FIG. 4 has a plastic deformation range above 20%, an excessive plastic deformation force of the electrical connecting pattern 244 in FIG. 4 may cause a break of an array element of the organic electroluminescent display (ELD) device 200 in FIG. 4 and thus cause an malfunction of the organic electroluminescent display (ELD) device 200. The aforementioned plastic deformation range that is required for the electrical connecting pattern 244 of the second embodiment of the present invention can be applied to the embodiments that will be described hereinafter.

Figure 6:
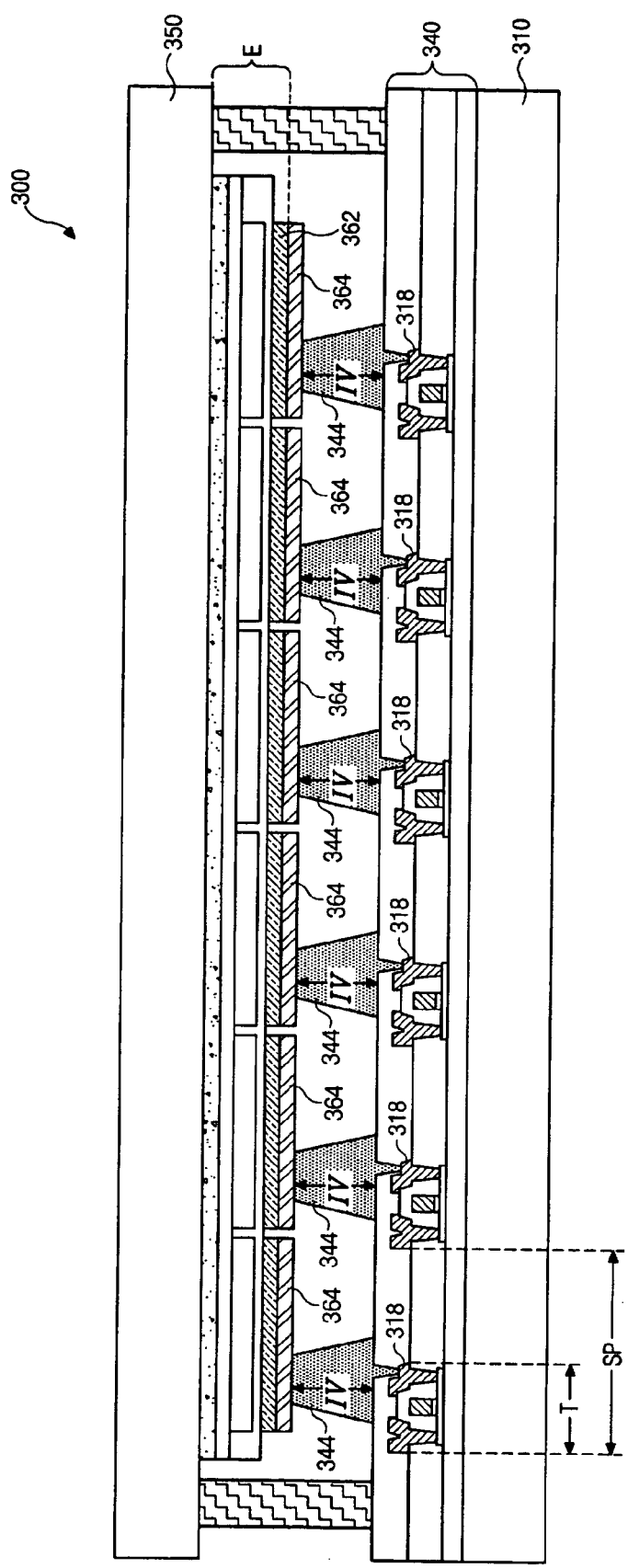
FIG. 6 is a cross-sectional view of a dual panel type organic electroluminescent display (ELD) device according to a third embodiment of the present invention.

FIG. 6 is a cross-sectional view of a dual panel type organic electroluminescent display (ELD) device according to a third embodiment of the present invention. In FIG. 6, an organic electroluminescent display (ELD) device 300 according to the third embodiment of the present invention has a first substrate 310 having an array element layer 340 formed thereon and a second substrate 350 having an organic electroluminescent diode "E" formed thereon, and an electrical connecting pattern 344 is formed between the first and second substrate 310 and 350. The electrical connecting pattern 344 is formed of material having a plastic deformation property and electrically connects the array element layer 340 with the organic electroluminescent diode "E".

In the third embodiment of the present invention, an additional protection electrode 364 is further formed on a second electrode 362 corresponding to each sub-pixel. Accordingly, the electrical connecting pattern 344 is electrically connected to a drain electrode 318 and the second electrode 362. The protection electrode 364 is disposed between the second electrode 362 and the electrical connecting pattern 344 and has a pattern structure corresponding to the second electrode 362. The protection electrode 364 functions as a kind of buffer electrode to protect the second electrode 362 from being damaged by a plastic deformation force of the electrical connecting pattern 344. The electrical connecting pattern 344 has a height "IV" that is a reduced height to an amount of 5~20% of an original height by the plastic deformation force of the electrical connecting pattern 344. Accordingly, the plastic deformation force of the electrical connecting pattern 344 improves contact properties between the electrical connecting pattern 344 and the array element layer 340 and between the electrical connecting pattern 344 and the organic electroluminescent diode "E". The electrical connecting pattern 344 of the third embodiment of the present invention can be formed of a conductive organic material as in the second embodiment of the present invention.

Figure 7:
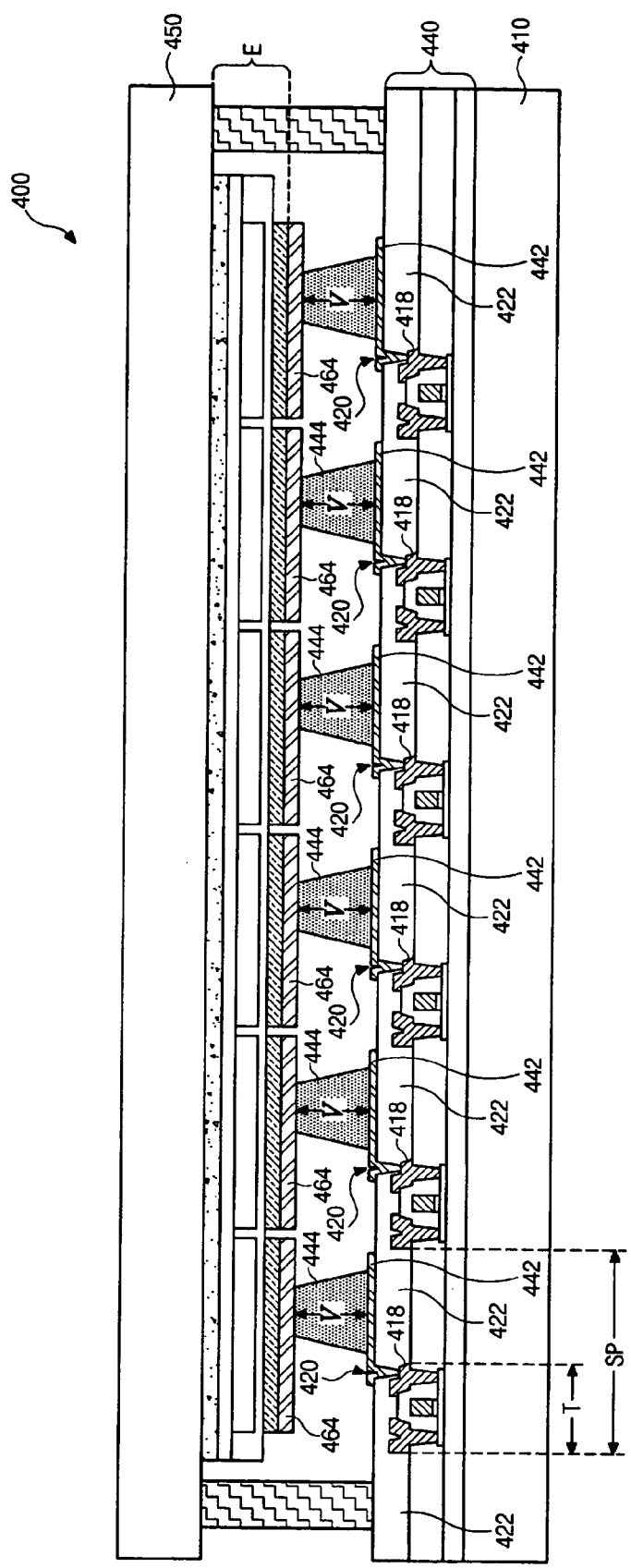
FIG. 7 is a cross-sectional view of a dual panel type organic electroluminescent display (ELD) device according to a fourth embodiment of the present invention.

FIG. 7 is a cross-sectional view of a dual panel type organic electroluminescent display (ELD) device according to a fourth embodiment of the present invention. In FIG. 7, an organic electroluminescent display (ELD) device 400 according to the fourth embodiment of the present invention has a first substrate 410 having an array element layer 440 and a second substrate 450 opposing the first substrate 410 and having an organic electroluminescent diode "E", and electrical connecting pattern 444 between the first and second substrates 410 and 450. The electrical connecting pattern 444 is formed of material having a plastic deformation property and is electrically connected to the array element layer 440 and the organic electroluminescent diode "E". A protection electrode 464 is formed on a second electrode 462 of each sub-pixel "SP" and a connecting electrode 442 is formed on the array element layer 440. That is, the protection electrode 464 is disposed between the second electrode 462 and the electrical connecting pattern 444 and has a pattern structure corresponding to the second electrode 462. Because the connecting electrode 442 is electrically connected to a drain electrode 418 and the electrical connecting pattern 444 connects the protection electrode 464 and the connecting electrode 442 electrically, an electric signal from the thin film transistor "T" can be delivered to the second electrode 462 via the electrical connecting pattern 444. The electrical connecting pattern 444 has a height "V" that is a reduced height to an amount of 5~20% of an original height by the plastic deformation force of the electrical connecting pattern 444. Accordingly, the plastic deformation force of the electrical connecting pattern 444 improves contact properties between the electrical connecting pattern 444 and the array element layer 440 and between the electrical connecting pattern 444 and the organic electroluminescent diode "E".

The electrical connecting pattern 444 of the fourth embodiment of the present invention can be formed of conductive organic material as in the previous embodiments of the present invention. As mentioned before, the connecting electrode 442 is electrically connected to the drain electrode 418 of the thin film transistor "T" and serves to protect the drain electrode 418 from an attachment force between the first and second substrates 410 and 450 and a plastic deformation force of the electrical connecting electrode 444. If the electrical connecting pattern 444 is electrically connected to the drain electrode 418 via a drain contact hole 420 formed through a passivation layer 422 without the additional connecting electrode 442, a contact property can be poor due to a small contact area between the electrical connecting pattern 444 and the drain electrode 418. However, because the electrical connecting pattern 444 is electrically connected to the drain electrode 418 through the intermediate connecting electrode 442, the contact property can be greatly improved by enlarging a contact area between the electrical connecting pattern 444 and the drain electrode 418.

Figure 8:
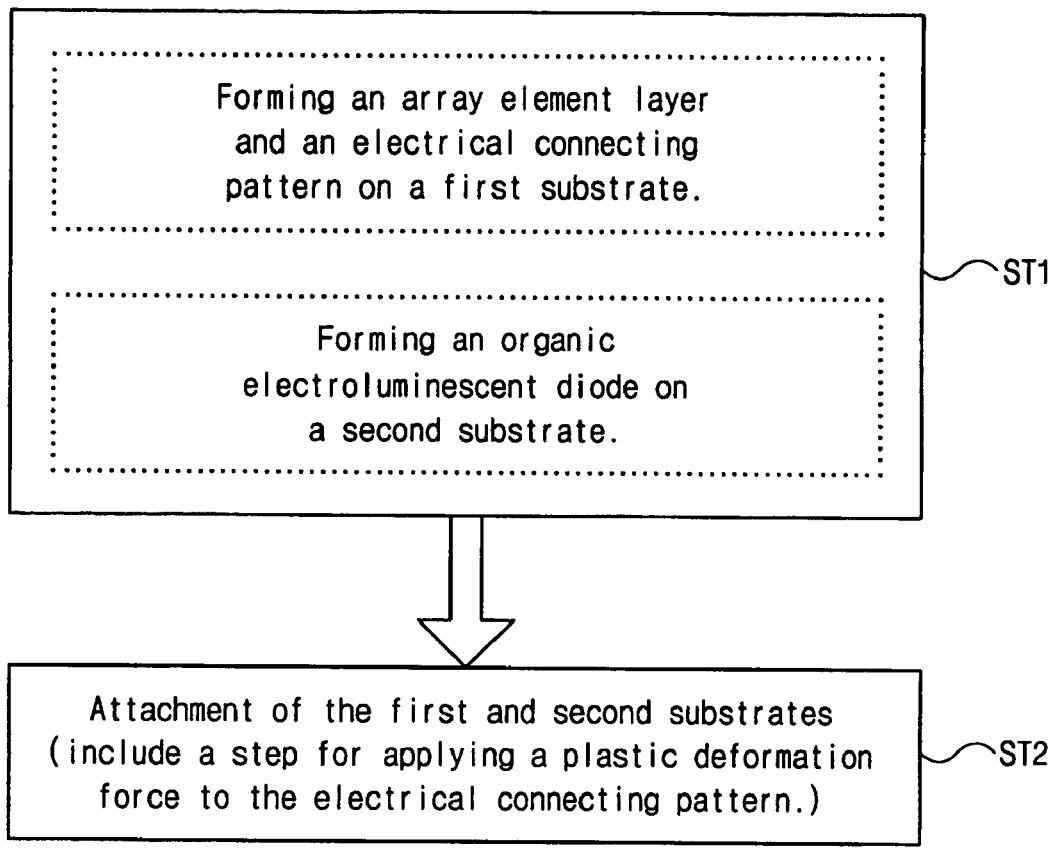
FIG. 8 is a flow chart illustrating a fabrication sequence of a dual panel type organic electroluminescent display (ELD) device of the present invention.

FIG. 8 is a flow chart illustrating an example of a fabrication sequence of a dual panel type organic electroluminescent display (ELD) device of the present invention. In one aspect of the present invention, the fabrication sequence for the dual panel type organic electroluminescent display (ELD) device having an electrical connecting pattern having a plastic deformation property, a connecting electrode and a protection electrode is taken for example. In a first step (ST1 in FIG. 8), an array element layer is formed on a first substrate and an organic electroluminescent diode is formed on a second substrate. A process for forming the array element layer on the first substrate comprises steps of forming a thin film transistor having a gate electrode, a source electrode and a drain electrode, forming a passivation layer having a drain contact hole to expose a portion of the drain electrode, forming a connecting electrode connected to the drain electrode via the drain contact hole and forming an electrical connecting pattern on the connecting electrode. The connecting electrode and the electrical connecting pattern are formed of conductive materials. Specifically, the electrical connecting pattern is formed of material having a plastic deformation property and preferable formed of material having a plastic deformation range of 5~20%. Accordingly, the electrical connecting pattern may be formed of conductive organic material.

A process for forming the organic electroluminescent diode on the second substrate having a plurality of sub-pixels "SP" defined thereon includes steps of forming a first electrode on the second substrate, forming an organic light-emitting layer having light-emitting layers for red (R), green (G) and blue (B) colors, forming a second electrode on the organic light-emitting layer corresponding to each sub-pixel and forming a protection electrode on the second electrode. The protection electrode has a pattern structure corresponding to the second electrode. The first and second electrodes and the organic light-emitting layer form the organic electroluminescent diode. The organic light-emitting layer and the second electrode may be formed separately for each sub-pixel by a shadow mask method or a partition using method. That is, the organic light-emitting layer and the second electrode may be formed in each sub-pixel by sequentially patterning the organic light-emitting layer and the second electrode according to the shadow mask method or may be separately formed in each sub-pixel automatically without additional pattering process by forming a plurality partitions in boundaries of each sub-pixel.

The protection electrode may be formed of conductive material and may desirably be formed thick to play a role of a buffer. The first step ST1 for forming the first and second substrates includes a seal patterning forming process. That is, the seal pattern is formed on one of the first and second substrates to attach the first and second substrates. In a second step (ST2 in FIG. 8), the first and second substrates are attached together by the seal pattern and this step includes a step for applying a plastic deformation force to the electrical connecting pattern to electrically connect the array element layer on the first substrate and the organic electroluminescent diode on the second substrate. Once the electrical connecting pattern receives the plastic deformation force, the electrical connecting pattern is compressed to have a certain height. The electrical connecting pattern of the present invention desirably has a plastic deformation range of 5~20%. With the existence of the electrical connecting pattern having the plastic deformation property, a contact property between the array element layer and the organic electroluminescent diode may be improved.

As mentioned previously, the dual panel type organic electroluminescent display (ELD) device having the electrical connecting pattern having the plastic deformation property has advantages as follows. First, because the array element layer and the organic electroluminescent diode are formed respectively on different substrates, a production yield can be increased and a life cycle of products can be extended. Secondly, because the dual panel type organic electroluminescent display (ELD) device according to the present invention is the top emission-type, the thin film transistor can be designed with facility and a high aperture ratio and a high resolution can be achieved. Thirdly, because the array element layer on the first substrate and the organic electroluminescent diode is electrically connected by the electrical connecting pattern having the plastic deformation property, a contact property between the array element layer and the organic electroluminescent diode can be improved by the plastic deformation force of the electrical connecting pattern.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. An organic electroluminescent display (ELD) device, comprising:
    first and second substrates having a plurality of sub-pixels defined thereon, the first and second substrates being spaced apart from and opposing each other;
    an array element layer on the first substrate, the array element layer having a plurality of thin film transistors corresponding to each sub-pixel;
    a first electrode on an inner side of the second substrate;
    an organic light-emitting layer beneath the first electrode;
    a second electrode corresponding to each sub-pixel beneath the organic light-emitting layer;
    a plurality of electrical connecting patterns corresponding to each sub-pixel between the array element layer and the second electrode, the electrical connecting pattern being formed of material having a plastic deformation property; and
    a seal pattern formed on one of the first and second substrates,
    wherein a height of the electrical connecting pattern is smaller than an original height of the electrical connecting pattern measured before an attachment of the first and second substrates.

2. The device according to claim 1, wherein the height of the electrical connecting pattern is between 80~95% of the original height of the electrical connecting pattern measured before the attachment of the first and second substrates.

3. The device according to claim 1, wherein the electrical connecting pattern is formed of conductive organic material.

4. The device according to claim 1, further comprising a protection electrode between the second electrode and the electrical connecting pattern, wherein the protection electrode has a pattern structure corresponding to the second electrode.

5. The device according to claim 4, wherein the electrical connecting pattern is electrically connected to the second electrode via the protection electrode.

6. The device according to claim 5, further comprising a connecting electrode on the array element layer, wherein the connecting electrode is connected to the thin film transistor.

7. The device according to claim 6, wherein the electrical connecting pattern is electrically connected to the thin film transistor via the connecting electrode.

8. The device according to claim 7, wherein the thin film transistor has a gate electrode, a source electrode and a drain electrode, and the connecting electrode is connected to the drain electrode.

9. The device according to claim 1, further comprising a connecting electrode on the array element layer, wherein the connecting electrode is connected to the thin film transistor.

10. The device according to claim 9, wherein the electrical connecting pattern is electrically connected to the thin film transistor via the connecting electrode.

11. The device according to claim 10, wherein the thin film transistor has a gate electrode, a source electrode and a drain electrode, and the connecting electrode is connected to the drain electrode.

12. The device according to claim 1, wherein the electrical connecting pattern is formed on the array element layer.

13. The device according to claim 1, wherein the organic electroluminescent display (ELD) device is a top emission-type.

14. A method for manufacturing an organic electroluminescent display (ELD) device, comprising steps of:
    forming an array element layer on a first substrate on which a plurality of sub-pixels are defined, the array element layer having a plurality of thin film transistors corresponding to each sub-pixel;
    forming an electrical connecting pattern having a first height on the array element layer corresponding to each sub-pixel, the electrical connecting pattern being formed of material having a plastic deformation property;
    forming an organic electroluminescent diode on a second substrate, the organic electroluminescent diode having first and second electrodes and an organic light-emitting layer between the first and second electrodes;
    forming a seal pattern on one of the first and second substrates; and
    attaching the first and second substrates together, wherein the first height of the electrical connecting pattern is reduced to a second height by applying a plastic deformation force to the electrical connecting pattern during the step of attaching the first and second substrates.

15. The method according to claim 14, wherein the second height is between 80~95% of the first height.

16. The method according to claim 14, wherein the electrical connecting pattern is formed of conductive organic material.

17. The method according to claim 14, further comprising a step of forming a connecting electrode corresponding to each sub-pixel on the array element layer after the step of forming the array element layer.

18. The method according to claim 17, wherein the step of forming the array element layer includes forming the thin film transistor having a gate electrode, a source electrode and a drain electrode, wherein the connecting electrode is connected to the drain electrode.

19. The method according to claim 14, further comprising a step of forming a protection electrode corresponding to each sub-pixel and having a pattern structure corresponding to the second electrode after the step of forming the organic electroluminescent diode.

20. The method according to claim 14, further comprising a step of forming a connecting electrode corresponding to each sub-pixel on the array element layer after the step of forming the array element layer, and a step of forming a protection electrode corresponding to each sub-pixel and having a pattern structure corresponding to the second electrode after the step of forming the organic electroluminescent diode.

21. The method according to claim 20, wherein the step of forming the array element layer includes forming the thin film transistor having a gate electrode, a source electrode and a drain electrode, wherein the connecting electrode is connected to the drain electrode.

22. The method according to claim 14, wherein the thin film transistor is a driving thin film transistor.

23. The method according to claim 14, wherein the organic electroluminescent display (ELD) device is a top emission-type.

* * * * *